(12) United States Patent
Tateishi et al.

(10) Patent No.: US 11,025,130 B2
(45) Date of Patent: Jun. 1, 2021

(54) ONBOARD DEVICE

(71) Applicant: SUBARU CORPORATION, Tokyo (JP)

(72) Inventors: Toshiya Tateishi, Tokyo (JP); Yukihito Inaba, Tokyo (JP); Tomoatsu Imamura, Tokyo (JP); Takeki Nemoto, Tokyo (JP); Hiroyuki Suzuki, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 26 days.

(21) Appl. No.: 16/736,468

(22) Filed: Jan. 7, 2020

(65) Prior Publication Data

US 2020/0303989 A1 Sep. 24, 2020

(30) Foreign Application Priority Data

Mar. 19, 2019 (JP) .............................. JP2019-051897

(51) Int. Cl.
*H02K 5/24* (2006.01)
*H05K 5/03* (2006.01)

(52) U.S. Cl.
CPC ................. *H02K 5/24* (2013.01); *H05K 5/03* (2013.01)

(58) Field of Classification Search
None
See application file for complete search history.

(56) References Cited

U.S. PATENT DOCUMENTS

| 4,677,540 | A | * | 6/1987 | Fujioka | ................ | H01R 12/523 |
|---|---|---|---|---|---|---|
| | | | | | | 361/773 |
| 8,757,304 | B2 | * | 6/2014 | Amano | ................. | B60L 3/0069 |
| | | | | | | 180/65.1 |
| 9,326,410 | B2 | * | 4/2016 | Courteille | .............. | H05K 5/026 |
| 2011/0309727 | A1 | * | 12/2011 | Kano | .................... | H05K 7/1461 |
| | | | | | | 312/223.2 |
| 2015/0130301 | A1 | * | 5/2015 | Billman | .................... | H02K 5/24 |
| | | | | | | 310/51 |
| 2016/0183400 | A1 | * | 6/2016 | Pan | ........................ | H05K 7/026 |
| | | | | | | 361/752 |
| 2016/0286677 | A1 | * | 9/2016 | Teusch | ................. | H05K 5/0247 |
| 2017/0088182 | A1 | * | 3/2017 | Hara | ................... | B62D 25/2072 |
| 2017/0327058 | A1 | * | 11/2017 | Takezawa | .......... | B60H 1/00278 |

FOREIGN PATENT DOCUMENTS

JP 5828313 B2 12/2015

* cited by examiner

*Primary Examiner* — Xanthia C Cunningham

(74) *Attorney, Agent, or Firm* — McDermott Will & Emery LLP

(57) ABSTRACT

An onboard device includes a first cover member having a first abutment surface, a second cover member having a second abutment surface abutting on the first abutment surface and an internal space for housing an electrical apparatus with the first cover member, a transmission portion that is formed in one or both of the first and second cover members, extends, from the first and second abutment surfaces, outward in an abutment direction in which the first and second abutment surfaces abut against each other and transmits sound more easily from the internal space to outside of the first and second cover members than adjacent regions in the first and second cover members, and a soundproof cover that has a through-hole penetrating in the abutment direction. The first abutment surface, the second abutment surface, and the transmission portion are located inside the through-hole.

4 Claims, 3 Drawing Sheets

ONBOARD DEVICE

CROSS-REFERENCE TO RELATED APPLICATIONS

The present application claims priority from Japanese Patent Application No. 2019-051897 filed on Mar. 19, 2019, the entire contents of which are hereby incorporated by reference.

BACKGROUND

The disclosure relates to an onboard device.

In an electrical apparatus such as an inverter, noise is generated by switching. Japanese Patent No. 5828313 discloses a technology in which noise leaked from an opening of a case main body to outside is suppressed by a soundproof material disposed in the opening.

SUMMARY

An aspect of the discloser provides an onboard device including a first cover member, a second cover member, a transmission portion, and a soundproof cover. The first cover member includes a first abutment surface. The second cover member includes a second abutment surface configured to abut on the first abutment surface and forms an internal space in which an electrical apparatus is housed, in cooperation with the first cover member. The transmission portion is formed in one or both of the first cover member and the second cover member, extends, from the first abutment surface and the second abutment surface, outward in an abutment direction in which the first abutment surface and the second abutment surface abut against each other. The transmission portion is configured to transmit sound more easily from the internal space to outside of the first cover member and the second cover member than adjacent regions in the first cover member and the second cover member. The soundproof cover has a through-hole penetrating in the abutment direction. The first abutment surface, the second abutment surface, and the transmission portion are located inside the through-hole.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

In the following, an embodiment of the disclosure is described in detail with reference to the accompanying drawings. Note that the following description is directed to an illustrative example of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiment which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same numerals to avoid any redundant description.

In a configuration described in Japanese Patent No. 5828313, it is not possible to suppress noise leaked to the outside from a wall portion other than the opening of the case main body. When a soundproof material is provided to cover the whole wall portion, the mass is increased.

Therefore, it is desirable to provide an onboard device that can suppress noise while suppressing increase of the mass.

Figure 1:
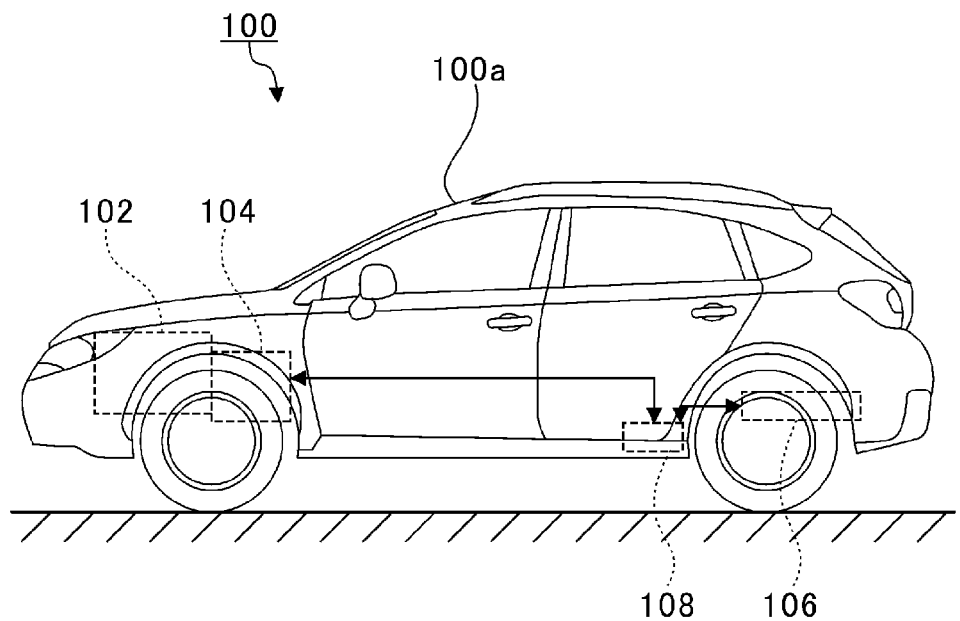
FIG. 1 is a diagram illustrating a configuration of a vehicle.

FIG. 1 is a diagram for explaining a configuration of a vehicle 100. In the following description, it is defined that a traveling direction of the vehicle 100 is a forward direction, a reverse travelling direction of the vehicle 100 is a reverse direction, the right side with respect to the traveling direction of the vehicle 100 is a right direction, the left side with respect to the traveling direction of the vehicle 100 is a left direction, a vertically upward direction is an upward direction, and a vertically downward direction is a downward direction.

As illustrated in FIG. 1, the vehicle 100 is a hybrid vehicle provided with an engine 102 and a motor generator 104. The engine 102 and the motor generator 104 are disposed under a hood in a front part of a vehicle body 100a.

The vehicle 100 is provided with a battery 106 and a PCU 108 (power control unit). The battery 106 is disposed below a trunk room in a rear part of the vehicle body 100a. The PCU 108 (onboard device) is disposed below a rear seat in a rear part of the vehicle body 100a.

In the vehicle 100, driving modes such as a motor driving mode where the vehicle 100 is driven by the motor generator 104 in preference to the engine 102 and an engine combined mode where the vehicle 100 is driven by using the motor generator 104 and the engine 102 in combination are prepared.

In the PCU 108, an electrical apparatus composed of a converter, an inverter, and the like are housed inside a casing. The PCU 108 is electrically coupled to the motor generator 104 and the battery 106. When the motor generator 104 functions as a driving source, the inverter in the PCU 108 converts electrical power charged in the battery 106 from DC power to AC power. The converter in the PCU 108 boosts a voltage of the AC power and supplies the voltage to the motor generator 104. The motor generator 104 is driven by the supplied voltage.

When the motor generator 104 functions as a power generator, the converter in the PCU 108 lowers voltage of AC power generated and obtained by the motor generator 104 using motive power of the engine 102. The converter in the PCU 108 converts the AC power whose voltage is lowered into DC power and supplies the DC power to the battery 106. The supplied power is charged into the battery 106.

Figure 2:
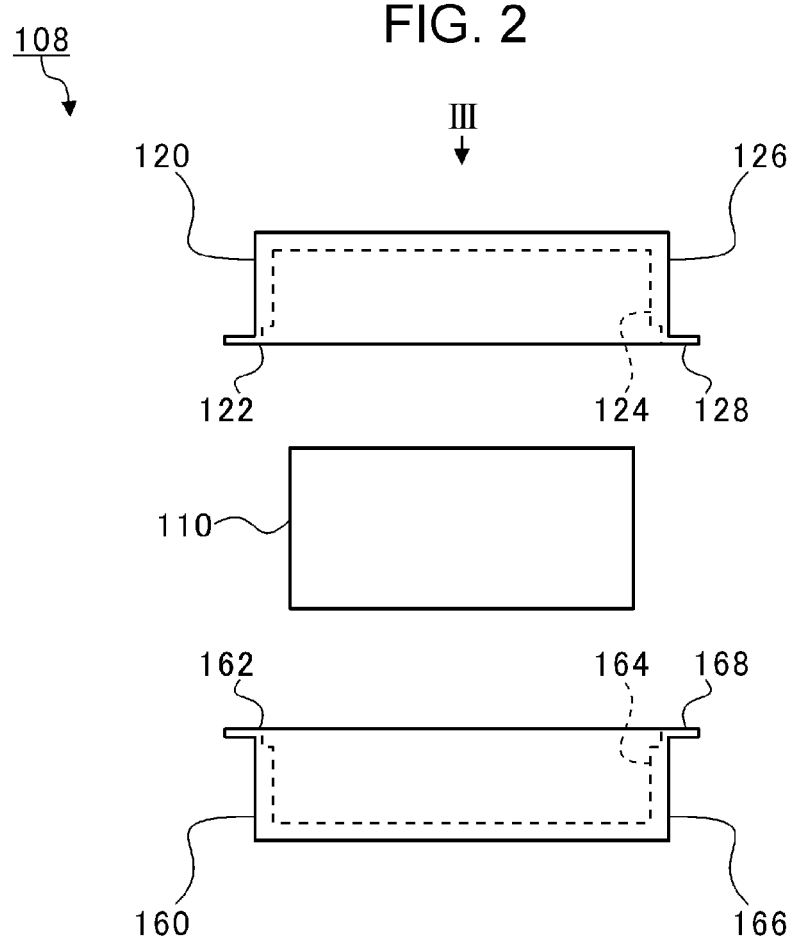
FIG. 2 is a diagram illustrating a state where an electrical apparatus, a first cover member, and a second cover member of PCU are disassembled.

FIG. 2 is a diagram illustrating a state where an electrical apparatus 110, a first cover member 120, and a second cover member 160 of the PCU 108 are disassembled. The electrical apparatus 110 has, for example, a substantially rectangular parallelepiped shape. The first cover member 120 and the second cover member 160 have substantially the same shape.

An outer shape of the first cover member 120 is substantially a rectangular parallelepiped shape. The first cover member 120 has a first abutment surface 122 abutting on the second cover member 160. The first cover member 120 is provided with a cover hole 124. The cover hole 124 opens in the first abutment surface 122. The cover hole 124 has a substantially rectangular parallelepiped shape.

A flange 128 is formed on a side wall 126 that forms an outside surface (outer circumferential surface) of the first cover member 120. The flange 128 is located on a side of the side wall 126 facing the second cover member 160. An end face of the flange 128 facing the second cover member 160 is a part of the first abutment surface 122.

The second cover member 160 has a second abutment surface 162 abutting on the first cover member 120. The second cover member 160 is provided with a cover hole 164. The cover hole 164 opens in the second abutment surface 162. The cover hole 164 has a substantially rectangular parallelepiped shape.

A flange 168 is formed on a side wall 166 that forms an outside surface (outer circumferential surface) of the second cover member 160. The flange 168 is located on a side of the side wall 166 facing the first cover member 120. An end face of the flange 168 facing the first cover member 120 is a part of the second abutment surface 162.

Figure 3:
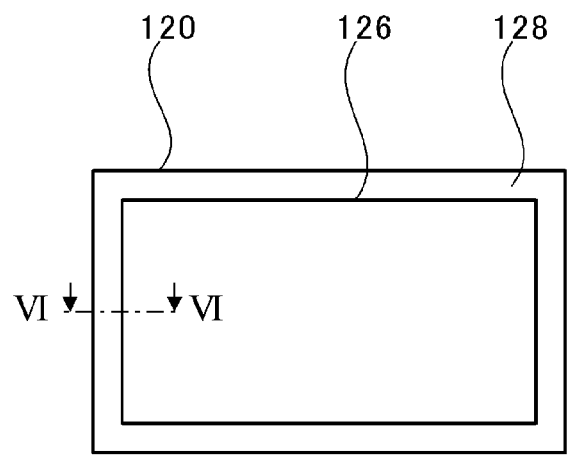
FIG. 3 is a fragmentary view of the first cover member taken in a direction of an arrow III in FIG. 2.

FIG. 3 is a fragmentary view of the first cover member 120 taken in a direction of an arrow III in FIG. 2. As illustrated in FIG. 3, the flange 128 extends over an entire circumference of the side wall 126. While FIG. 3 illustrates the first cover member 120, the second cover member 160 has the same configuration as that of the first cover member 120.

Figure 4:
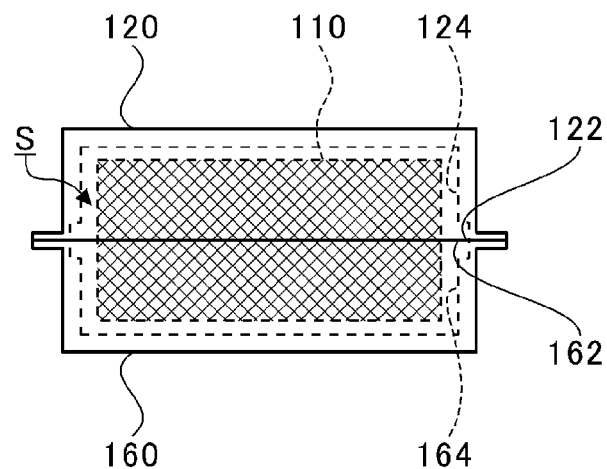
FIG. 4 is a diagram of the electrical apparatus, the first cover member, and the second cover member, which have been assembled.

FIG. 4 is a diagram of the electrical apparatus 110, the first cover member 120, and the second cover member 160, which have been assembled. In FIG. 4, the electrical apparatus 110 is indicated by cross-hatching. As illustrated in FIG. 4, the first abutment surface 122 of the first cover member 120 and the second abutment surface 162 of the second cover member 160 abut on each other. At this time, an internal space S is formed by the two cover holes 124 and 164. The electrical apparatus 110 is housed in the internal space S.

Figure 5:
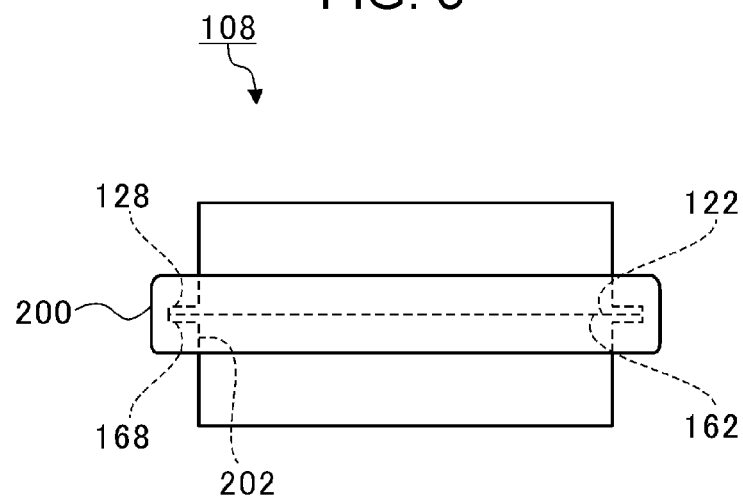
FIG. 5 is a diagram of the PCU to which a soundproof cover has been attached.

FIG. 5 is a diagram of the PCU 108 to which a soundproof cover 200 has been attached. As illustrated in FIG. 5, the soundproof cover 200 is composed of a material such as urethane foam that absorbs high frequency sound. The soundproof cover 200 has a through-hole 202.

The through-hole 202 penetrates the soundproof cover 200 in a direction in which the first abutment surface 122 and the second abutment surface 162 abut against each other (vertical direction In FIG. 5, hereinafter simply referred to as an abutment direction). The soundproof cover 200 has, for example, an annular shape. The first abutment surface 122, the second abutment surface 162, and the two flanges 128 and 168 are located inside the through-hole 202. The soundproof cover 200 surrounds entire circumferences of the first abutment surface 122, the second abutment surface 162, and the two flanges 128 and 168.

Figure 6:
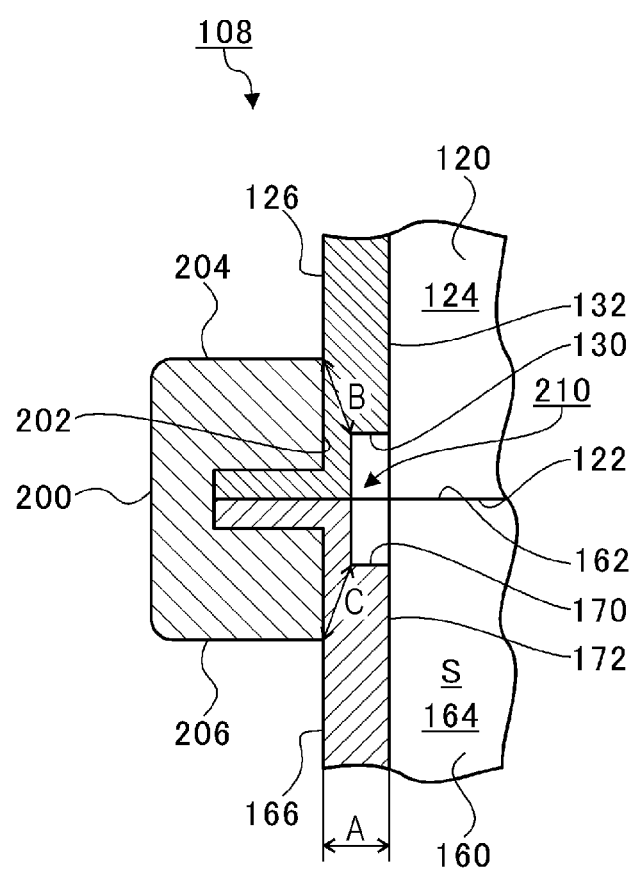
FIG. 6 is a cross-sectional view of the PCU, to which a soundproof cover has been attached, taken along line VI-VI in FIG. 3.

FIG. 6 is a cross-sectional view of the PCU 108, to which the soundproof cover 200 has been attached, taken along line VI-VI in FIG. 3. FIG. 6 extracts and illustrates vicinity of the first abutment surface 122 and the second abutment surface 162.

As illustrated in FIG. 6, a groove 130 is formed in the first cover member 120. The groove 130 is formed in a portion of the side wall 126 facing the cover hole 124. The groove 130 extends from the first abutment surface 122 in a direction away from the second cover member 160 (upward in FIG. 6). The groove 130 is formed in a boundary area between the first abutment surface 122 and the cover hole 124.

Similarly, a groove 170 is formed in the second cover member 160. The groove 170 is formed in a portion of the side wall 166 facing the cover hole 164. The groove 170 extends from the second abutment surface 162 in a direction away from the first cover member 120 (downward in FIG. 6). The groove 170 is formed in a boundary area between the second abutment surface 162 and the cover hole 164.

The thickness of a region where the grooves 130 and 170 are formed in the first cover member 120 and the second cover member 160 is smaller than that of regions where the grooves 130 and 170 are not formed. The region where the grooves 130 and 170 are formed and whose thickness becomes small functions as a transmission portion 210.

For example, the transmission portion 210 is formed in both the first cover member 120 and the second cover member 160. However, the transmission portion 210 may be formed in only one of the first cover member 120 and the second cover member 160.

The transmission portion 210 extends outward in the abutment direction from the first abutment surface 122 and the second abutment surface 162. For example, the transmission portion 210 extends upward from the first abutment surface 122 in FIG. 6. The transmission portion 210 extends downward from the second abutment surface 162 in FIG. 6. The transmission portion 210 is located inside the through-hole 202 of the soundproof cover 200. The thickness of the transmission portion 210 is smaller than those of adjacent regions 132 and 172 adjacent to the transmission portion 210 in the first cover member 120 and the second cover member 160.

Therefore, the transmission portion 210 transmits sound more easily from the internal space S to the outside of the first cover member 120 and the second cover member 160 than the adjacent regions 132 and 172. Sound generated from the electrical apparatus 110 tends to travel to the transmission portion 210 where sound is relatively easily transmitted. Sound that has passed through the transmission portion 210 is absorbed by the soundproof cover 200.

In this way, the transmission portion 210 is located inside the through-hole 202 of the soundproof cover 200, so that noise is suppressed. The sound of the electrical apparatus 110 travels toward the transmission portion 210, so that the noise is suppressed when the soundproof cover 200 is provided only around the transmission portion 210. Therefore, it is possible to more reduce mass and cost than when the soundproof cover 200 covers the entire first and second cover member 120 and 160.

Rust easily occurs on the first abutment surface 122 and the second abutment surface 162. Therefore, antirust agent is applied to the first abutment surface 122 and the second abutment surface 162 and their vicinity. Here, the soundproof cover 200 surrounds the first abutment surface 122 and the second abutment surface 162, so that the soundproof cover 200 has an antirust function in addition to the soundproof function described above.

The soundproof cover 200 extends to the outside of the transmission portion 210 in the abutment direction. Therefore, a large part of the sound that passes leftward through the transmission portion 210 in FIG. 6 is absorbed by the soundproof cover 200.

The thickness of the adjacent regions 132 and 172 of the transmission portion 210 is defined as thickness A. A distance B between an end 204 of the soundproof cover 200 on one side of the abutment direction (upper side in FIG. 6) and the transmission portion 210 is longer than the thickness A. Similarly, a distance C between an end 206 of the soundproof cover 200 on the other side of the abutment direction (lower side in FIG. 6) and the transmission portion 210 is longer than the thickness A. Here, the distance B and the distance C are the same. However, the distance B and the distance C may be different.

As described above, the distances B and C are longer than the thickness A. Even when sound travelling toward the transmission portion 210 whose thickness is shorter than the thickness A passes through the transmission portion 210 in an upper left direction or a lower left direction in FIG. 6, the sound is difficult to pass through a path longer than the thickness A. Therefore, most of the sound that has passed through the transmission portion 210 is absorbed by the soundproof cover 200.

While the embodiment of the present disclosure has been described with reference to the accompanying drawings, it is needless to say that the present disclosure is not limited to the example. It is obvious that those skilled in the art can make various changes or modifications within the scope described in the claims, and of course, it is understood that these changes or modifications are within the technical scope of the present disclosure.

For example, in the embodiment described above, a case is described where the thickness of the transmission portion 210 is smaller than that of the adjacent regions 132 and 172. However, for example, when the first cover member 120 and the second cover member 160 are composed of metal, the transmission portion 210 may more easily transmit sound than the adjacent regions 132 and 172.

In the embodiment described above, a case is described where the soundproof cover 200 extends outward more than the transmission portion 210 in the abutment direction. However, the soundproof cover 200 and the transmission portion 210 may be located at the same position in the abutment direction, or the soundproof cover 200 may extend less than the transmission portion 210 in the abutment direction.

In the embodiment described above, a case is described where the distances B and C between the transmission portion 210 and the ends 204 and 206 of the soundproof cover 200 in the abutment direction are longer than the thickness A of the adjacent regions 132 and 172. However, the distances B and C may be the same as the thickness A or may be shorter than the thickness A.

In the embodiment described above, a case is described where the grooves 130 and 170 are formed in portions of the side walls 126 and 166 facing the cover holes 124 and 164. However, the grooves 130 and 170 may be formed in portions of the side walls 126 and 166 opposite to the cover holes 124 and 164 (may be formed outside the internal space S).

In the embodiment described above, the electrical apparatus 110 is composed of, for example, an inverter and a converter. However, the electrical apparatus 110 is not limited to this. For example, the electrical apparatus 110 may be an electric powered pump.

According to the embodiment of the present disclosure, it is possible to suppress noise while suppressing increase of the mass.

The invention claimed is:

1. An onboard device comprising:
a first cover member comprising a first abutment surface;
a second cover member that comprises a second abutment surface configured to abut on the first abutment surface and forms an internal space in which an electrical apparatus is housed, in cooperation with the first cover member;
a transmission portion that is formed in one or both of the first cover member and the second cover member, and extends, from the first abutment surface and the second abutment surface, outward in an abutment direction in which the first abutment surface and the second abutment surface abut against each other, the transmission portion being configured to transmit sound more easily from the internal space to outside of the first cover member and the second cover member than adjacent regions in the first cover member and the second cover member; and
a soundproof cover that has a through-hole penetrating in the abutment direction, wherein
the first abutment surface, the second abutment surface, and the transmission portion are located inside the through-hole.

2. The onboard device according to claim 1, wherein a thickness of the transmission portion is smaller than those of the adjacent regions.

3. The onboard device according to claim 2, wherein the soundproof cover extends to outside of the transmission portion in the abutment direction.

4. The onboard device according to claim 3, wherein a distance between an end of the soundproof cover in the abutment direction and the transmission portion is longer than the thicknesses of the adjacent regions.

* * * * *